United States Patent [19]

Donaldson et al.

[11] Patent Number: 4,527,074
[45] Date of Patent: Jul. 2, 1985

[54] HIGH VOLTAGE PASS CIRCUIT

[75] Inventors: Darrel D. Donaldson, Kettering; Edward H. Honnigford; Alan D. Poeppelman, both of Dayton, all of Ohio

[73] Assignee: NCR Corporation, Dayton, Ohio

[21] Appl. No.: 433,292

[22] Filed: Oct. 7, 1982

[51] Int. Cl.[3] ............... H03K 17/06; H03K 17/687
[52] U.S. Cl. ........................... 307/246; 307/573; 307/574; 307/582
[58] Field of Search ............ 307/246, 443, 450, 453, 307/481, 482, 572–575, 582

[56] References Cited

U.S. PATENT DOCUMENTS 4,061,933 12/1977 Schroeder et al. ................. 307/481

FOREIGN PATENT DOCUMENTS 2094086 9/1982 United Kingdom .

OTHER PUBLICATIONS

Gupta et al., "A 5V-Only 16K EEPROM Utilizing Oxynitride Dielectrics and EPROM Redundancy", IEEE International Solid State Circuits Conference, vol. 25, Feb. 1982, New York, U.S.A.
Gerber et al., "Low-Voltage Single Supply CMOS Electrically Erasable Read-Only Memory", IEEE Transactions on Electron Devices, vol. ED-27, No. 7, Jul. 1980.
Fujitsu, "Amplifier Circuit of Internal Signal", 56-19589(A), Feb. 24, 1981, Patents Abstracts of Japan, vol. 5, No. 73, May 15, 1981, p. (P-61)745.

Primary Examiner—John Zazworsky
Attorney, Agent, or Firm—J. T. Cavender; Casimer K. Salys

[57] ABSTRACT

An electronic circuit configured to pass relatively high voltage signals therethrough when enabled, and block both positive and negative signals when appropriately disabled. The features of the circuit are particularly suited for coupling write and erase voltages to a nonvolatile memory array while integrated on a common chip with the array. In one form, the circuit includes a two-phase pump, which upon being enabled draws a transient current from the high voltage input line and raises the voltage level on an internal capacitive node in closed loop fashion by effecting unidirectional transfers of charge between successive capacitive nodes. The elevated internal voltage provides a driving signal to a driving circuit which passes the high voltage on the input line to an output line without incurring threshold voltage losses.

10 Claims, 5 Drawing Figures

HIGH VOLTAGE PASS CIRCUIT

BRIEF SUMMARY

The present invention relates to an electronic integrated circuit suitably configured to pass relatively high voltages from an input line to an output line, or selectively block high voltages presented to either the input or output line, in response to a single low voltage enable signal. In the particular arrangement of field effect transistors (FETs) utilized, the circuit draws a limited, transient current from the power supply providing the high voltage, while passing the high voltage from input to output with no threshold voltage losses. In one embodiment, the circuit utilizes relatively conventional n-channel FETs, operates from a nominal 5 volt power supply, and is suitably arranged to pass in excess of 20 volts in the context of a write and erase control for a nonvolatile memory array.

In the composite embodiment of the preferred high voltage pass circuit, a pump circuit and a high voltage drive circuit are supplemented with a negative voltage protection circuit, a multiplicity of decoupling circuits, and a pair of negative voltage blocking circuits to perform the described operations. The featured pump circuit is synchronously driven by a two-phase clock. Charge is drawn from the high voltage power supply, through a gating FET, to increase the voltage on a first node having distributed capacitance. Thereafter, the pumping action of the two-phase clock increases the voltage on the first node and transfers charge unidirectionally through a natural threshold FET to a second capacitive node. The second node provides enabling voltage to both the high voltage drive circuit and the aforementioned gating FET. In this way, the circuit takes the form of a closed loop arrangement, in which the movement of charge is initiated by the enable signal, and sustained and elevated thereafter by the pumping action of the two-phase clock. The path by which the enable line initiates pumping also serves to disable the high voltage pass circuit when the enable signal is at a low level.

As was noted above, the composite high voltage pass circuit includes various forms of negative voltage protection. The featured negative voltage blocking circuit at the high voltage input line of the high voltage pass circuit incorporates a series connected FET which is appropriately disabled by a depletion FET when the voltage on the high voltage input line is negative. Threshold voltage losses through the negative voltage blocking circuit during the pass operation are avoided by elevating the voltage on the gate electrode of the series connected FET. The higher voltage is generated by pumping a capacitively loaded node with the clock signal and regulating the charge flow with body effect in the depletion FET.

The second negative voltage blocking circuit, at the output side of the high voltage pass circuit, is comprised of a pair of FETs which short the gate and drain electrodes of the FET in the high voltage drive circuit. The FET in the high voltage drive circuit controls the actual passage of high voltage from the input line to the output line.

During negative voltage on the output line of the high voltage pass circuit, the path to the enable line is disconnected by the negative voltage protection circuit. In one form, it is comprised of a series FET which is selectively biased with a negative voltage on the gate electrode.

As embodied, the high voltage pass circuit also includes a group of decoupling circuits. These circuits selectively decouple the clock inputs of the high voltage pass circuit from the two-phase clock to remove the capacitive loads of the high voltage pass circuit when it is disabled. Upon considering the exemplary nonvolatile memory array application, it will be appreciated that the multiplicity of high voltage pass circuits would otherwise impose a significant loading on the two-phase clock lines, irrespective of the number of high voltage pass circuits actually operating. An embodying decoupling circuit includes a gating FET, connected in series with the clock signal line and gated by the enable line. The enable line is itself connected through a forward biased FET. The forward biased FET bootstraps the gating FET gate voltage sufficiently to ensure that the clock signal does not sustain a threshold voltage drop in progressing to the pump or blocking circuits.

These and other unique features of the present invention will become more clearly understood upon considering the ensuing detailed description of the preferred embodiment.

DETAILED DESCRIPTION

Figure 1:
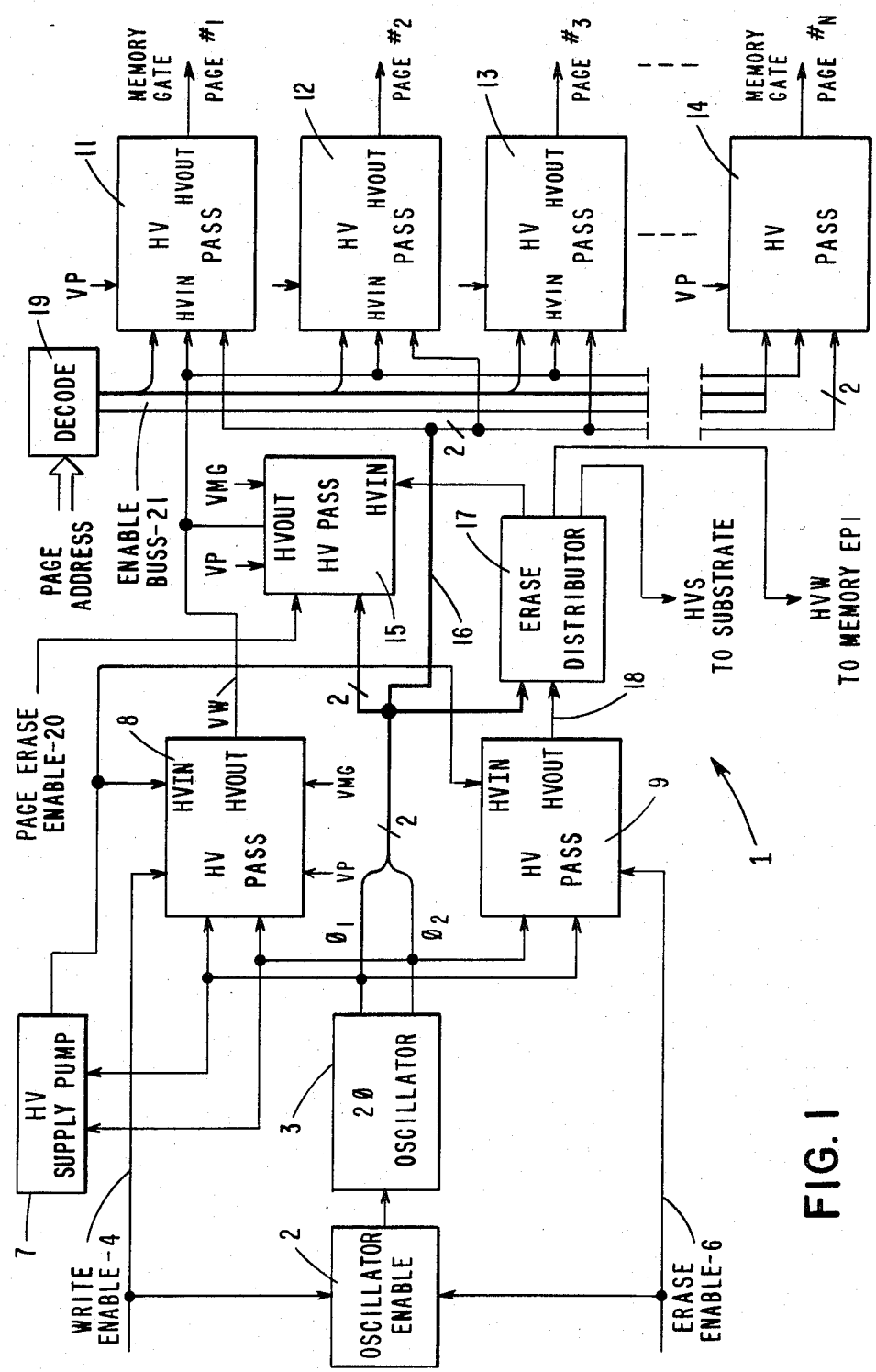
FIG. 1 is a schematic block diagram of a write and erase control for a nonvolatile memory array.

To understand the benefits of the present high voltage pass circuit, and to gain some appreciation for its range of applications, the ensuing description will begin with a brief presentation of the context within which the present high voltage pass circuit can be utilized. In this respect, attention is directed to write and erase control system 1 for a nonvolatile memory array as generally shown in FIG. 1 of the drawings. The nominal voltages suitable to perform the write and erase operations appear in Table I.

TABLE I

| Operation | Memory Gate Lines | Memory Epi (HVW) | Substrate (HVS) | Erase Enable | Page Erase Enable | Write Enable |
|---|---|---|---|---|---|---|
| Block erase | 0 volts (all pages) | +20 volts | +22 volts | +5 volts | 0 volts | 0 volts |
| Page erase | +20 volts (pages not to be | +20 volts | +22 volts | +5 volts | +5 volts | 0 volts |

TABLE I-continued

| Operation | Memory Gate Lines | Memory Epi (HVW) | Substrate (HVS) | Erase Enable | Page Erase Enable | Write Enable |
| --- | --- | --- | --- | --- | --- | --- |
| Write | erased) 0 volts (page to be erased) +20 volts (page to be written) 0 volts (pages not to be written) | −2.5 volts | +5 less $V_T$ | 0 volts | 0 volts | +5 volts |

The illustrated control system is utilized to block erase, page erase (groups of 16 bytes), or write a nonvolatile (NV) memory array configured with silicon-nitride-oxide-semiconductor (SNOS) type devices. In the preferred configuration, the array is fabricated to be part of a single integrated circuit chip which includes substantially all the circuitry necessary to erase, write and read data in the memory array. It should be recognized that the description of the system in FIG. 1 is relatively abbreviated, in that SNOS memory arrays and conventionally associated high voltage supply pump, decode, oscillator, and distributor circuitry is relatively common knowledge, whereas the high voltage pass circuit of the present form is not. It is noteworthy with reference to FIG. 1, that configurations of the high voltage pass circuit appear repeatedly in the control system, and as such can contribute significantly to the area consumed if the design is not efficiently implemented at the device level. A brief description of the operations performed by exemplified memory array control system 1 follows.

Referring to FIG. 1, oscillator enable circuit 2 generates a signal to initiate the operation of two-phase oscillator clock circuit 3 when a signal appears on write enable line 4 or erase enable line 6. The output signals from two-phase oscillator circuit 3, clock signals $\phi_1$ and $\phi_2$, are supplied to high voltage supply pump circuit 7, erase distributor 17, and high voltage pass circuits 8, 9 and 15. Clock signals $\phi_1$ and $\phi_2$ are also coupled to the multiplicity of high voltage pass circuits corresponding to the memory gate pages, including high voltage pass circuits 11-14, on two-line buss 16.

The relatively high level of the DC voltage generated in high voltage supply pump circuit 7 is connected to the HVIN terminals of high voltage pass circuits 8 and 9. The output of high voltage pass circuit 8, from the HVOUT terminal on line VW, is distributed to the HVIN terminals of high voltage pass circuits 11-14. Output line 18 from high voltage pass circuit 9 is coupled through erase distributor circuit 17 to the pair of lines HVS and HVW, which are respectively the electrical connections of the chip substrate and of the memory epitaxial layer. The third output line from erase distributor 17 is connected to the HVIN terminal of high voltage pass circuit 15. Erase distributor 17 merely replicates the HVOUT signal as it appears on line 18, while decoupling the output lines from each other.

The erasure of selected pages within the NV memory array is performed by selectively transmitting the erase voltage on line VW to designated memory gate electrodes of the NV SNOS devices. In the present embodiment, the devices have been organized into groups by pages numbering #1 to #N. The addresses of the pages to be erased, or written, are entered as a binary bit code into decoder 19, which selectively enables the high voltage pass circuits corresponding to the address code. The enable signals are transmitted on enable buss 21. As is no doubt evident from the embodiment, the division of the NV memory array into N pages inherently requires N individual high voltage pass circuits. An operational description of memory array control system 1 follows.

The operations defined by Table I can now be related to the corresponding functional blocks in FIG. 1. During the block erase operation, all memory gate lines connected to the HVOUT terminals of high voltage pass circuits 11-14, are held at 0 volts by the appropriate page addresses, while lines HVW and HVS are biased to +20 and +22 volts, respectively, using high voltage pass circuit 9. The elevation of the voltage from the +20 volts on line 18 to the +22 volts on line HVS is performed by a simple clocked pump circuit within erase distributor 17. The two volt margin ensures that parasitic bipolar transistors elsewhere on the chip remain disabled. During this period, a +5 volt signal is provided to erase enable line 6.

The page erase operation is similar, except that the page address causes an enabling of selectively designated high voltage pass circuits from the group beginning with 11 and extending through 14. In this case, the +20 volts on line 18 from high voltage pass circuit 9 is coupled to line VW through high voltage pass circuit 15. Thereafter, the +20 volts on line VW is selectively distributed to the pages not to be erased according to the signals on enable buss 21. During this operation, both erase enable line 6 and page erase enable line 20 are at +5 volts.

The write operation performed by memory array control system 1 is commenced with a +5 volt signal on write enable line 4. The write enable-signal actuates high voltage pass circuit 8 to couple +20 volts from the HVOUT terminal onto line VW. Thereafter, the +20 volts is selectively connected to the memory gate line, #1 to #N, according to the page addresses on buss 21. During the write operation, lines HVS and HVW are biased by separate means to approximately +4 volts and −2.5 volts, respectively. While writing, high voltage pass circuit 9 is disabled and high voltage pass circuit 15 decouples the −2.5 volts on line HVW from line VW.

Given the frequency with which the high voltage pass circuit appears in the memory control system, together with the variety of signals it must be capable of handling, one begins to appreciate the capability and contribution of such a circuit. A complete configuration of the high voltage pass circuit is depicted in FIG. 2.

Figure 2:
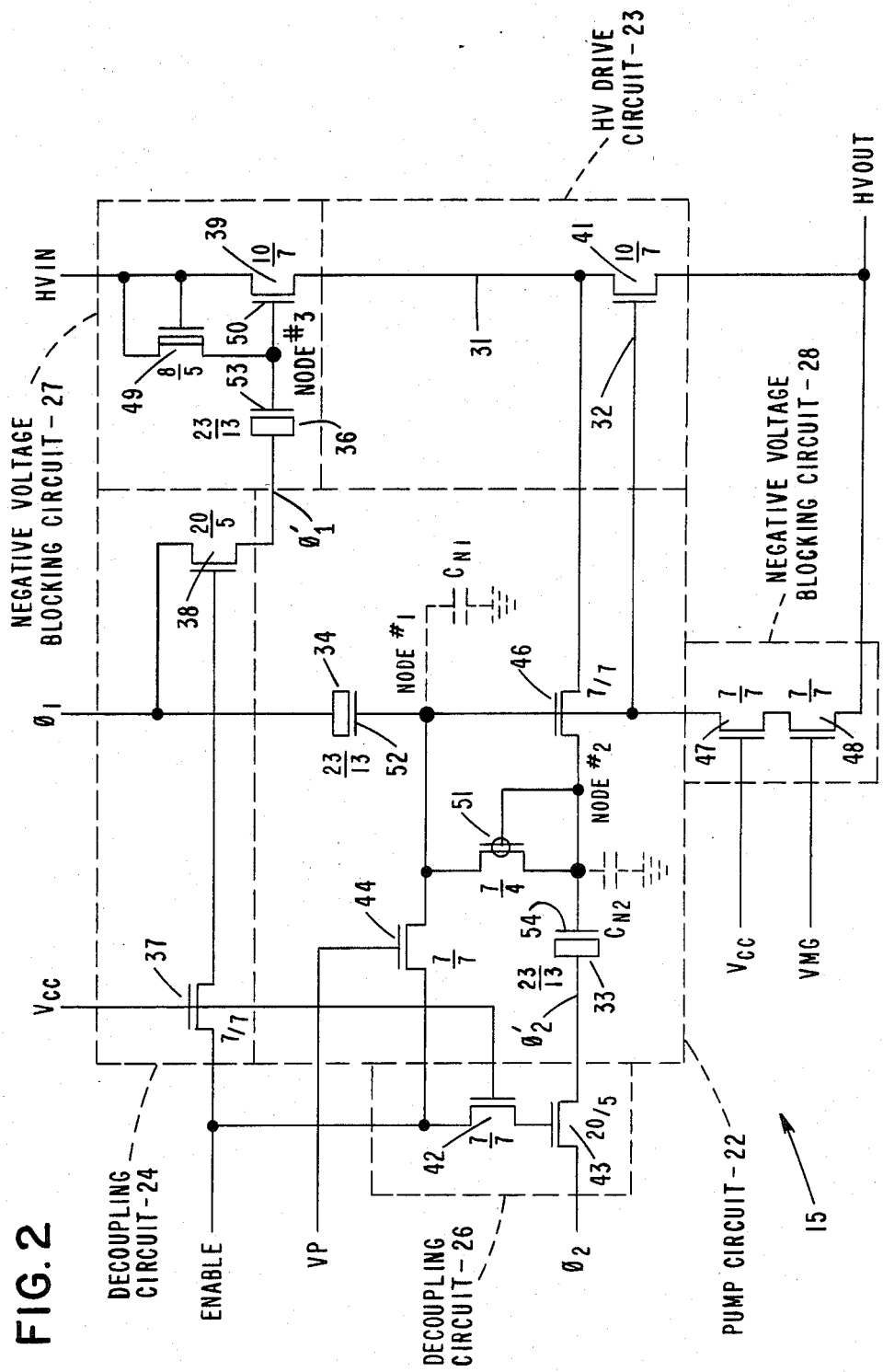
FIG. 2 is a schematic diagram of a high voltage pass circuit embodying the features of the present invention.
Figure 3:
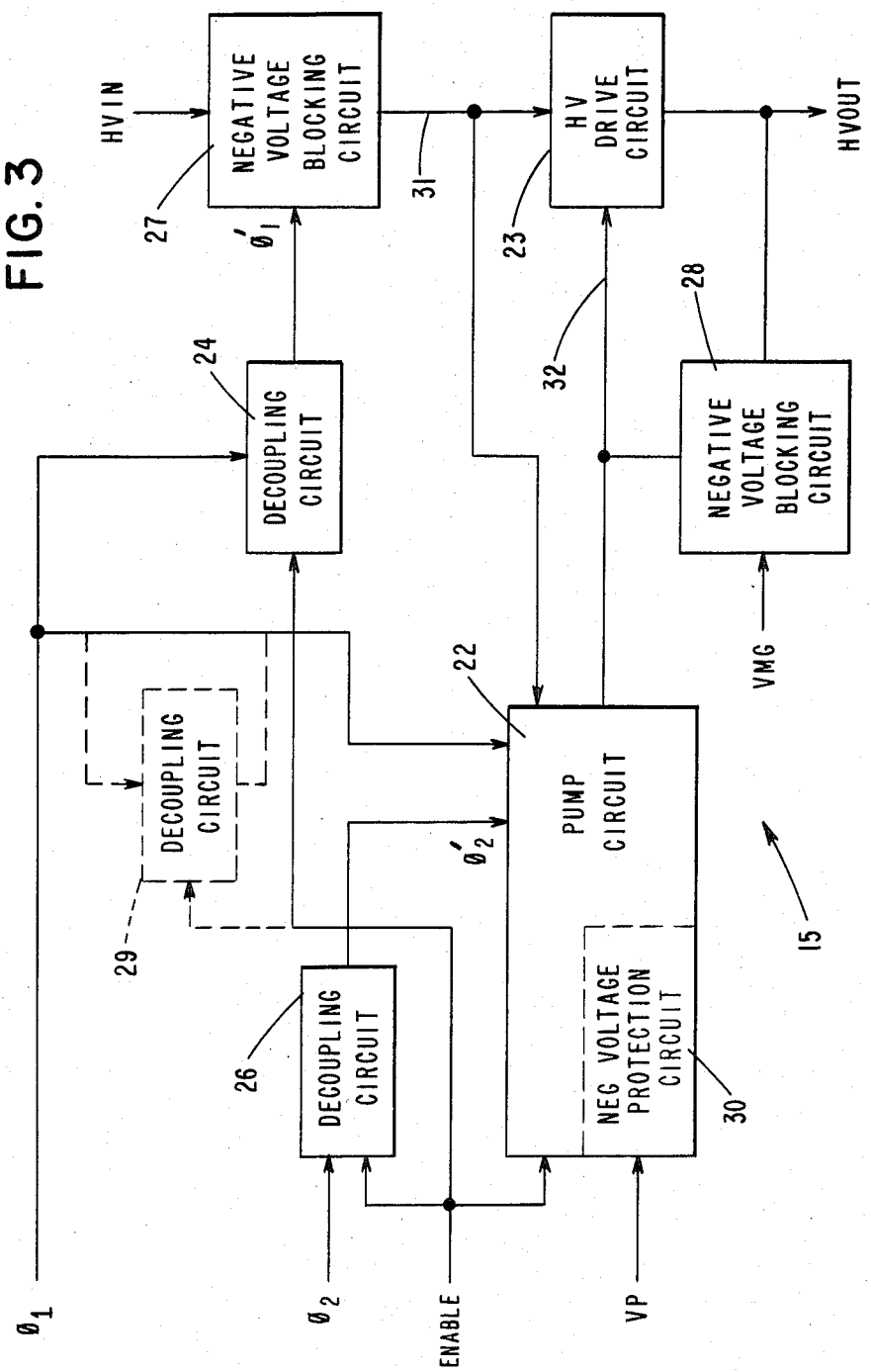
FIG. 3 is a schematic block diagram depicting the functional sections forming the circuit in FIG. 2.

The interconnection of the functional blocks which make up FIG. 2 are shown in FIG. 3 to aid in the understanding of the interrelationships. One skilled in the art will undoubtedly recognize the efficiency with which the complex functions defined by the blocks in FIG. 3 are physically implemented by active semiconductor devices as shown in FIG. 2. Nevertheless, it should be understood that the various configurations of the high voltage pass circuit implemented in control system 1 (FIG. 1) are composed according to their particular circuit requirements, whereby only high voltage pass circuit 15 includes all the functional sections actually depicted in FIGS. 2 and 3. By virtue of its circuit location it is subject to all the variabilities of voltage contemplated for a high voltage pass circuit. Therefore, the description which follows will utilize this arrangement over alternative, simpler configurations.

The circuit in FIGS. 2 and 3 will be described hereinafter in two separate stages. The first stage will involve a composite description considering the functional blocks and their interaction. The second stage will contain a description of the operations performed by the individual devices within the functional blocks.

With regard to FIG. 3, it should be understood that the central elements to the present invention are represented by the features contained in the pump circuit section, 22, the high voltage drive circuit section, 23, and the negative voltage blocking circuit section, 27. However, the fully complemented embodiment also includes a negative voltage blocking circuit, 28, a pair of decoupling circuits, 24 and 26, and a negative voltage protection circuit incorporated within pump circuit 22. Decoupling circuits 24 and 26 contribute by reducing the load driven by clock lines $\phi_1$ and $\phi_2$. Phantom block 29 in FIG. 3 depicts the presence of a decoupling circuit which, by virtue of the present configuration, was not required in the embodiment of FIG. 2. Negative voltage blocking circuits 27 and 28 prevent the passage of negative voltages between terminals HVIN and HVOUT. Negative voltage protection circuit 30 (FIG. 3) represents a functional arrangement of pump circuit 22 configured to prevent a negative voltage on terminal HVOUT from propagating through to the enable line. Though not essential to the basic invention, the latter-described supplemental circuits clearly expand the versatility of the high voltage pass circuit.

Continuing at the functional block level, the description will now focus on the operation of the high voltage pass circuit in performing the functions necessary to write and erase a nonvolatile memory array, though the invention is not limited to that narrow scope of applications. The fundamental feature of the high voltage pass circuit 15 is the ability to pass a high voltage between terminals HVIN and HVOUT without suffering threshold voltage losses. To accomplish this, pump circuit 22 receives the high voltage from line 31 and uses the two-phase clock signals $\phi_1$ and $\phi_2'$ to provide a further elevated voltage on line 32. Thereby, the elevated voltage compensates for threshold voltage losses otherwise introduced in sending the high voltage on line 31 through high voltage drive circuit 23. Pump circuit 22 is enabled by a +5 volt signal on the enable line.

Control input line VP is maintained at +5 volts unless a negative voltage is anticipated on terminal HVOUT, in which case it is biased with −5 volts. The −5 volt signal on line VP coincides with margining type testing. Decoupling circuits 24, 26, and potentially 29 are present to substantially eliminate the capacitive load on clock lines $\phi_1$ and $\phi_2$ from high voltage pass circuits which are disabled. Were it not for the multiplicity of high voltage pass circuits utilized to erase and write the memory by selected page, the clock loading would likely remain within acceptable limits. Note, the passage of clock signals through the decoupling circuits occurs only when a +5 volt signal appears on the enable line.

Negative voltage blocking circuit 27 inhibits the passage of any negative voltage on terminal HVIN onto line 31. When high voltage pass circuit 15 is enabled, no voltage loss is introduced between HVIN and 31 by virtue of a pump arrangement within negative voltage blocking circuit 27, which pump is driven by decoupled clock signal $\phi_1'$.

The remaining negative voltage blocking circuit, 28, ensures that negative voltage on terminal HVOUT does not pass back through the FET in high voltage drive circuit 23, by imposing a substantial short between line 32 and terminal HVOUT when HVOUT is subject to negative voltages. At that time, line VMG is provided with a +5 volt bias signal. In general, a negative voltage appears on HVOUT only during margining type testing of the NV device memory window. The procedure is routinely performed by those skilled in the fabrication of SNOS type NV memory devices.

With the functional level relationships defined, the ensuing description will focus on the organization and characteristic contributions of the various active and passive devices within the circuit embodied in FIG. 2. In considering the present embodiment, it should be noted that the design shown in FIG. 2 is powered from a +5 volt supply, the $V_{cc}$ voltage. The devices have a field plate zener capability of approximately 25 volts. The width/length ratios of the devices are shown adjacent to each in FIG. 2. In the present embodiment, capacitors 33, 34 and 36 are conventional enhancement capacitors, often characterized as enhancement FETs with commonly connected source/drain electrodes. FETs 37, 38, 39, 41, 42, 43, 44, 46, 47 and 48 are relatively conventional enhancement type devices with a threshold voltage ($V_T$) of approximately 0.8 volts. FET 49 in negative voltage blocking circuit 27 is a light depletion type device, having a threshold voltage approximately −1.5 volts. FET 51 has a threshold voltage of approximately 0 volts, a configuration generally known as a natural FET. Capacitors $C_{N1}$ and $C_{N2}$ represent the effective distributed node capacitance on respective nodes #1 and #2. As a general design rule, capacitors 33 and 34 should be significantly greater (by a factor in excess of 10:1) than $C_{N1}$ and $C_{N2}$ to obtain efficient operation from pump circuit 22. Other relationships of the individual devices within the circuits will become evident after each circuit is considered individually.

The signals which are coupled to high voltage pass circuit 15 in FIG. 2 have been partially described previously. However, it is worth noting that the clock signals on lines $\phi_1$ and $\phi_2$ are generally square waves, differing by approximately 180° in phase, ranging in voltage between 0 volts and +5 volts, and having a nominal frequency of 5–20 MHz. Operation of each high voltage pass circuit is initiated with a +5 volt signal on the enable line and terminated with a 0 volt signal on the enable line. Though line VP is, as described earlier, normally +5 volts, it is capable of being biased at other voltages during the margining tests on the memory window of SNOS type NV devices in the memory array. This use is, however, of secondary consideration and well beyond the scope of the present invention.

Figure 4:
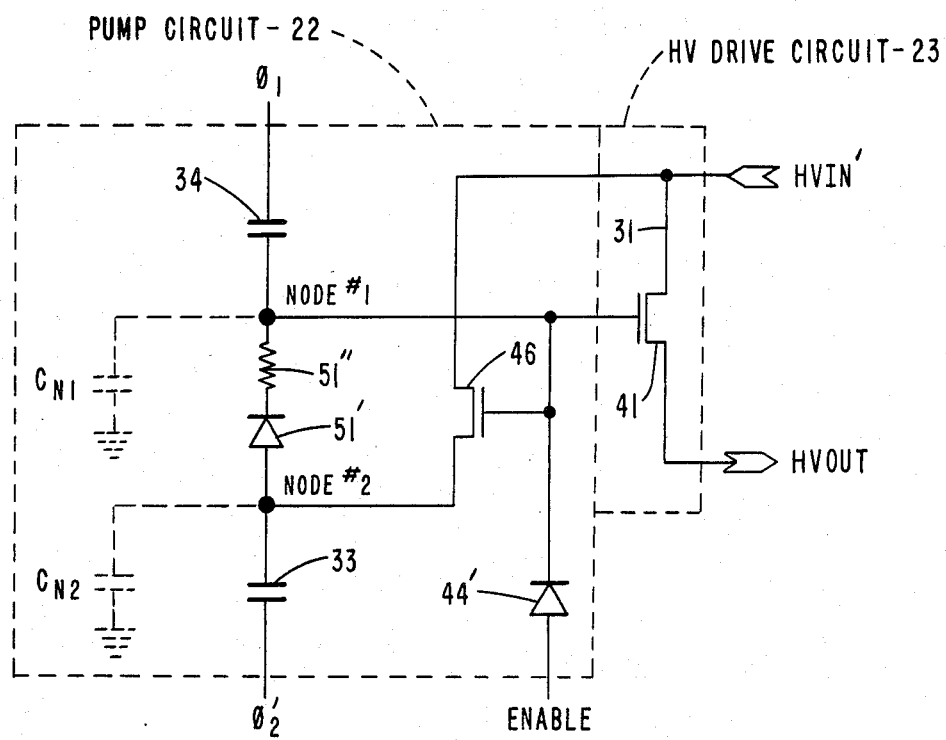
FIG. 4 is a schematic diagram representing a simplified functional equivalent of the pump and high voltage drive circuits from FIGS. 2 and 3.

The focus of attention will now be directed to pump circuit 22 and high voltage drive circuit 23, as a combination. A functional equivalent for the combination is depicted in FIG. 4. The presence of a prime symbol adjacent a reference symbol indicates functional correspondence between elements in FIGS. 2 and 4.

The structure of the operating equivalent circuit shown in FIG. 4 presents an arrangement of capacitor 33, node #2, diode 51', resistor 51", node #1 and capacitor 34 between two-phase clock signals $\phi_1$ and $\phi_2'$. Nodes #1 and #2 are shown to be capacitively coupled to ground potential through respective capacitors $C_{N1}$ and $C_{N2}$. Node #1 is further connected to the gate electrode of FET 41 in high voltage drive circuit 23 and to the enable line through diode 44'. Node #2 is separated from HVIN' by the path through FET 46.

The operation of pump circuit 22, in terms of the equivalent circuit in FIG. 4, begins with a positive signal on the enable line. This signal turns on FET 46, which then supplies charge from HVIN' to node #2, and in succession to node #1. The clock signals are thereafter utilized to elevate the potential of node #2, and cause a further transfer of charge through diode 51' and resistor 51" to node #1. In closed loop fashion, the elevation of the voltage on node #1 biases FET 46 to further charge node #2 with voltage from HVIN'. The clocking and charge transfer is repeated until node #2 reaches the amplitude of the voltage on HVIN' and node #1 is at least 5 volts greater. Thereby, the gate electrode of drive circuit FET 41 is raised sufficiently above the voltage on HVIN' to ensure that the voltage at HVOUT does not suffer a threshold voltage drop in passing through FET 41.

Figure 5:
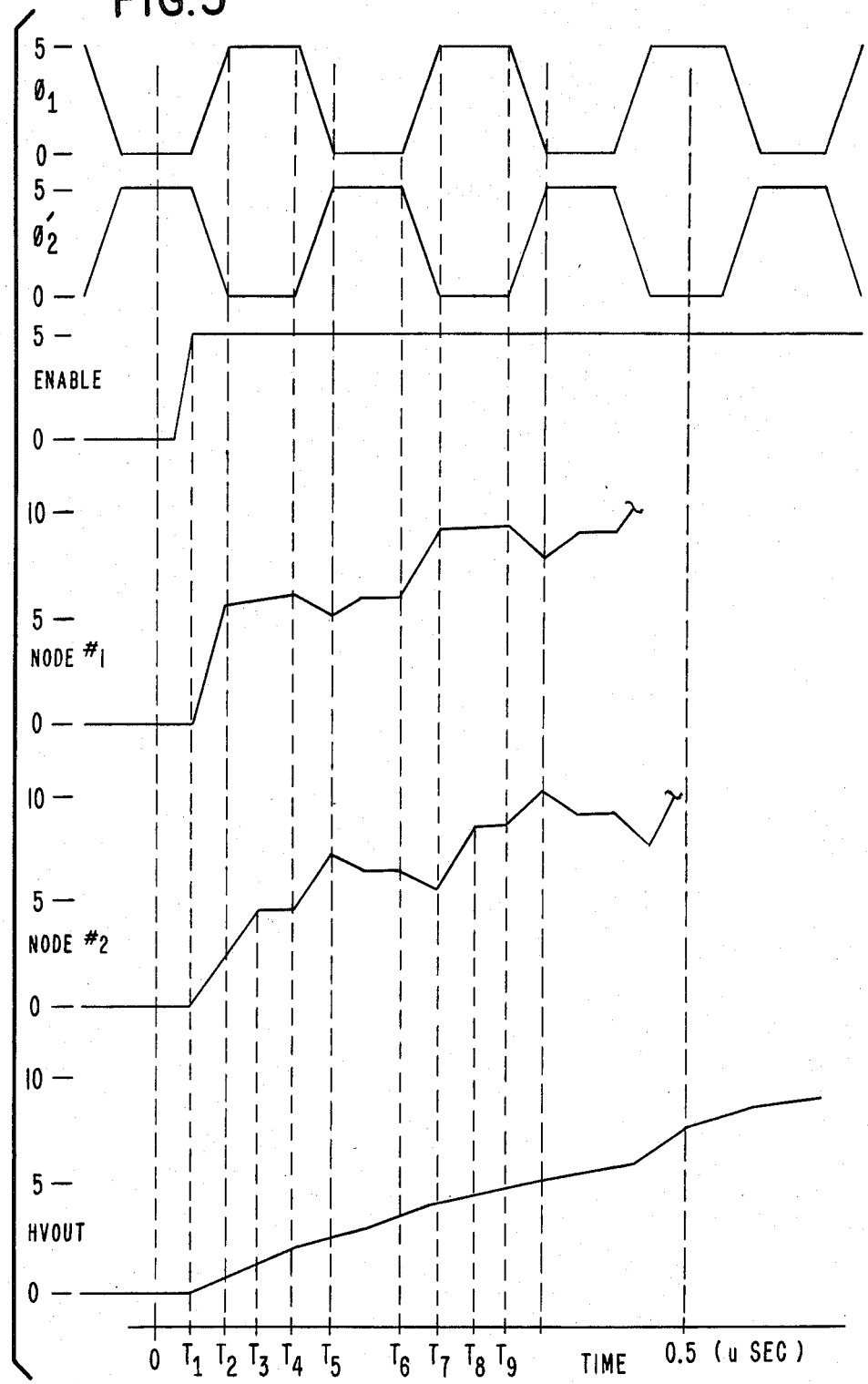
FIG. 5 presents exemplary waveforms for the voltage signals on various nodes and lines of the high voltage pass circuit in FIG. 2.

The sequence of events characterizing the operation of pump circuit 22 and high voltage drive circuit 23 are best understood by referring to the waveforms of the various signals as shown in FIG. 5. Considering FIGS. 4 and 5 together, it is apparent that prior to the 5 volt enable signal, node #1 is held to 0 volts. This is accomplished by FET 44 (FIG. 2). Following the rise of the enable signal to +5 volts at time $T_1$, node capacitance $C_{N1}$ is charged to elevate node #1 to approximately 5 volts. By time $T_2$, enhancement FETs 41 and 46 have become conductive, connecting the HVIN' terminal to both HVOUT and node #2. Though the voltage on node #1 has generally stabilized at time $T_2$, the voltage on node #2 continues to increase until time $T_3$ by virtue of the charge flowing between HVIN' and capacitor $C_{N2}$ in response to the transconductance of FET 46. During the period of time immediately after $T_3$, the voltages on nodes #1 and #2 differ by the threshold of FET 46. The pumping operation is cyclically repeated until the voltage on node #2 reaches that on terminal HVIN'.

The contribution of the signal from the enable line through diode 44' should not be overlooked. It is used to precharge node #1, which precharge is necessary to first enable FET 46 and thereby initiate the transfer of charge from HVIN' to node #2. Without the enabling voltage, FET 46 would normally remain nonconductive by virtue of it being an enhancement type device. It should, however, be recognized that functional diode 44' reverts to its FET structure when the enable line is at 0 volts, and draws node #1 to the same potential.

To understand the contribution of the two-phase clock signals after the enable transients preceding time $T_3$ have subsided, one should consider the equivalent circuit in FIG. 4 at times $T_4$ and $T_9$. For instance, at times $T_4$ clock signals $\phi_1$ and $\phi_2'$ initiate their transition between their 0 and +5 volt levels. During the time interval between $T_4$ and $T_5$, node #2 is raised in potential by the positive going transition of the $\phi_2'$ signal through a charge sharing between relatively large capacitor 33 and relatively small capacitor $C_{N2}$. To some extent, charge is also shared between capacitor 34 and capacitor $C_{N1}$, but to a lesser degree by virtue of the intervening resistance 51". At the time that clock signal $\phi_2'$ increases, signal $\phi_1$ transitions downward to 0 volts. With the downward transition, node #1 is pulled negatively by the charge sharing between relatively large capacitor 34 and relatively small capacitor $C_{N1}$. This action draws even further charge from node #2 to node #1, by virtue of the greater voltage difference. At some point in time before $T_6$, the voltages on nodes #1 and 2 stabilize and differ in magnitude by the threshold of FET 51 (FIG. 2).

The time interval between $T_6$ and $T_7$ encompasses the opposite transition of signals $\phi_1$ and $\phi_2'$. The rise in the signal on line $\phi_1$ results in a charge sharing between capacitors 34 and $C_{N1}$ to elevate node #1 by approximately 3 volts. In contrast, node #2 is drawn down by the drop in the voltage on line $\phi_2'$. The lesser amount of the drop on node #2, recognizing the blocking action of diode 51', is attributable to the charge supplemented through FET 46 from line HVIN'. Node #2 continues to receive charge from HVIN' through FET 46 until time $T_8$, at which point the voltage on node #1 is one threshold greater than on node #2. The cyclic operation is repeated with time $T_9$ at the 5 MHz clock rate, until HVOUT equals HVIN'.

In terms of pump efficiency based on charge sharing it is preferred that capacitor 34 be significantly greater in capacitance than capacitor $C_{N1}$. Generally, a factor of 3 or greater is suitable; however, a factor in excess of 10 is preferred. A similar preferential relationship is sought between capacitor 33 and capacitor $C_{N2}$. Pump operation efficiency also dictates that capacitors 33 and 34 be substantially equal in value. Consideration of the equivalent circuit in FIG. 4 and the waveforms in FIG. 5 also show that FET 51 (FIG. 2), represented by diode 51' and resistor 51", should be a device having a threshold voltage of approximately 0 volts and minimum effective resistance. Though these considerations are not crucial to the basic operation of the pump circuit, they do represent a preferable arrangement for practicing the invention.

With an understanding of the structural and operational features which characterize pump circuit 22 and high voltage drive circuit 23, attention is now directed back to FIG. 2 for consideration of another unique aspect of the present invention. The focus of attention will now be on negative voltage blocking circuit 27, used to block negative voltages appearing on line HVIN, while passing positive voltages from line HVIN to line 31 with no voltage drop. The blocking action is performed by creating an electrical connection between the gate and source electrodes of FET 39 through depletion mode FET 49 whenever line HVIN is negative with respect to line 31.

To understand the unique contributions obtained from FET 49, consider the device in the context of the requirements necessary for the appropriate operation of negative voltage blocking circuit 27. To pass positive voltage, gate electrode 50 of FET 39, connected to node #3, must be pumped to a voltage at least one threshold above that on HVIN. In the embodiment, the pumping is accomplished by utilizing the $\phi_1$ clock signal, conveyed to node #3 through FET 38 and capacitor 36. If FET 49 were a conventional depletion mode device, the pumping action through capacitor 36 would be ineffective by virtue of the conductive path through FET 49 to line HVIN. Nevertheless, FET 49 must be a depletion mode device to provide the basic negative voltage blocking function attributed to the circuit. The apparent dichotomy of operational objectives required of FET 49 is overcome by using a very lightly doped depletion FET. In that configuration, the depletion mode of operation is retained for negative voltage blocking. However, when HVIN is at a high positive voltage, the body effect on FET 49 shifts the threshold from a slightly depleted level to a slightly enhanced level. With FET 49 in an enhancement mode, node #3 can be raised above HVIN by $\phi_1$ signal pumping. In this way, the uniquely defined characteristics of FET 49 provide negative voltage blocking circuit 27 with the capability both to block negative voltages and to selectively pass positive voltages without suffering threshold losses.

The presence of FET 39 in the path between HVIN and line 31 also provides a modest increment of field plate zener protection for FET 41, in the case where line 32 is at or near ground potential by virtue of a 0 volt level on the enable line while HVIN is at a maximum voltage. In that situation, the voltage on node #3 is at HVIN and the combination of threshold and body effect cause a drop of approximately 3 volts across FET 39. The added margin ensures that FET 41 does not field plate zener even with worst case voltages on HVIN.

Attention is now directed to the structure and contributions of negative voltage blocking circuit 28, as it appears in the embodiment of FIG. 2. In the context of the embodiment, the purpose of negative voltage blocking circuit 28 is to block the negative voltage on line HVOUT from being coupled through enhancement mode FET 41 to line 31. To prevent FET 41 from conducting when HVOUT is a negative voltage, line VMG is changed from its normal 0 volt level to +5 volts. With that condition, the gate electrode of FET 41 is shorted directly to its source electrode.

Though the +5 signal on VMG prevents the passage of negative voltage, not exceeding −5 volts, to line 31, it does create a path for the negative voltage on line HVOUT, through FETs 48 and 47, to reach node #1. A negative voltage on node #1 does not itself create a problem. However, if FET 44 is conductive the negative voltage will be connected to the enable line. To avoid this, line VP is biased with −5 volts whenever negative voltage appears on HVOUT. In FIG. 3 this operation is functionally represented by negative voltage protection circuit 30.

The various states for the voltages on both line VP and VMG are summarized in Table II to indicate when they occur and their effect in the circuit. Since the last condition occurs only during voltage margining tests on the NV devices in the chip, it provides a predictable means for controlling the voltage supplied to lines VP and VMG.

TABLE II

| VP VOLTAGE | VMG VOLTAGE | ENABLE LINE CONDITIONS | EFFECT ON NODE #1 |
| --- | --- | --- | --- |
| +5 volts | 0 volts | Enable line at 0 v. | Holds node #1 to 0 v. and disables pump circuit 22 |
| +5 volts | 0 volts | Enable line at +5 volts and node #1 less than +5 v. | Allows node #1 to rise to positive voltage and enables pump circuit 22 |
| +5 volts | 0 volts | Enable line at +5 volts and node #1 greater than +5 v. | Acts as diode 44' (FIG. 4) to block node #1 voltage from the enable line |
| −5 volts | +5 volts | Enable line at 0 volts | Blocks negative voltage at node #1 from the enable line |

FET 47 in negative voltage blocking circuit 28 is present to protect FET 48 from field plate zener breakdowns. FET 47 is required because node #1 can be pumped to a level of approximately 27 volts, which magnitude exceeds the nominal breakdown of FET 48. Since such field plate zener protection circuits are generally known within the art, further description of the arrangement is unwarranted.

The remaining sections of the high voltage pass circuit in FIG. 2 include decoupling circuits 24 and 26. Reference to FIG. 3 indicates that a corresponding decoupling circuit 29, has been deleted from the present embodiment because of adequate, preexisting decoupling. Referring back to FIG. 2, circuit 24 serves to decouple negative voltage blocking circuit 27 from loading clock signal $\phi_1$ when high voltage pass circuit 15 is not operating; that is, when the signal on the enable line is at 0 volts. Decoupling circuit 26 performs the same operation with respect to clock signal $\phi_2$ for the remaining clocked input to pump circuit 22. As noted earlier, the need for circuits such as 24, 26 and 29 are related to the number of high voltage pass circuits and the drive capability of the two-phase clocking oscillator 3 (FIG. 1).

The operations of decoupling circuit 24 and 26 are substantially identical. When the enable line voltage is at 0 volts, FETs 38 and 43 disconnect lines $\phi_1'$ and $\phi_2'$ from $\phi_1$ and $\phi_2$, respectively. A change in the enable voltage from 0 to +5 volts connects 5 volts, less the threshold drops associated with FETs 37 and 42, to the gate electrodes of FETs 38 and 43. However, with the cyclic transition of clock signals on lines $\phi_1$ and $\phi_2$ the gate electrodes of FETs 38 and 43 are boot-strapped to a voltage of approximately 5 volts greater than the DC level conducted from the enable line. In this way, the signals on lines $\phi_1'$ and $\phi_2'$ are not subjected to threshold losses in passing through FETs 38 and 43.

The absence of a decoupling circuit in the line connecting $\phi_1$ into pump circuit 22 is attributable to the substantial lack of coupling provided through enhancement capacitor 34 when the enable line and node #1 are at approximately 0 volts. Namely, when gate electrode 52 of capacitor 34 is at 0 volts, the channel which creates enhancement capacitor 34 is absent.

The same zero gate voltage situation does not exist for enhancement capacitors 33 and 36. In the case of enhancement capacitor 36, the presence of a high voltage on line HVIN is coupled to node #3 and gate electrode 53. In the case of enhancement capacitor 33, gate electrode 54 is connected to node #2. Since electrode 54 is isolated by FET 51 from the ground potential at node #1, it may under some conditions float with sufficient potential to form significant capacitance in enhancement capacitor 33. To avoid loading the clock lines with high voltage pass circuits which are not enabled, the present embodiment incorporates decoupling circuits, such as 24 and 26, where necessary.

The preferred embodiment illustrated in FIGS. 2 and 3 utilizes a two-phase clock signal to pump the high voltage pass circuit. Though a standard relative phase of 180° between the signal on line $\phi_1$ and that on line $\phi_2$ is contemplated, a nominally different phase angle will sustain operation, but at a reduced level of pump efficiency. In this respect, it should also be noted that the general high voltage pass circuit may, under limited conditions, be pumped by a single phase clock signal. The implications of using a single clock signal will be considered briefly hereinafter.

The preferred embodiment of the high voltage pass circuit is capable of raising the voltage on node #1 to approximately 27 volts when HVIN is at 20 volts. The 7 volt difference between the voltage on line 32 (FIG. 2), connected to node #1, and the voltage on line 31, the HVIN voltage, ensures that the full 20 volts appears on line HVOUT. However, if lesser voltages are acceptable at line HVOUT, for example 15 volts, then a single phase clock signal embodiment of pump circuit 22 is suitable. The nominal output voltage for a single phase pump, as measured on line 32, is in the range of 22 volts.

The structure of a high voltage pass circuit with a single phase clock is similar to the two-phase embodiment shown in FIG. 2. In particular, capacitor 34 and line $\phi_1$ are eliminated. With this arrangment, node #1 is not pumped directly, but rather, is always charged from node #2 through natural FET 51.

From the foregoing description of the invention, in the context of both preferred and alternate embodiments, it is evident that the fundamental concepts are susceptible to numerous variations depending on the particular requirements of the application. One should, therefore, recognize that the invention as claimed should be accorded not only the scope but the spirit of the invention shown and described by way of the embodiments herein.

We claim:

1. A high voltage pass circuit for selectively connecting an input line to an output line, comprising:
    means for coupling an input voltage on said input line to said output line in response to a first voltage on a first capacitive node, when said first voltage exceeds said input voltage;
    means for transferring charge from said input line to a second capacitive node, when said first voltage exceeds the voltage on said second capacitive node; and
    pump means for repetitively transferring charge unidirectionally from said second capacitive node to said first capacitive node.

2. The high voltage pass circuit recited in claim 1, further including, means for precharging said first capacitive node to enable said high voltage pass circuit, and discharging said first capacitive node to disable said high voltage pass circuit.

3. The high voltage pass circuit recited in claim 2, wherein said pump means is comprised of:
    a first capacitive device connected by a first terminal to said second capacitive node;
    a first source of clock signals coupled to a second terminal of said first capacitive device; and
    diode means connected to pass charge from said second capacitive node to said first capacitive node.

4. The high voltage pass circuit recited in claim 3, further including:
    a second capacitive device connected by a first terminal to said first capacitive node; and
    a second source of clock signals coupled to a second terminal of said second capacitive device and having a clock signal phase opposite that generated by said first source.

5. The high voltage pass circuit recited in claim 4, wherein:
    said means for coupling comprises a field effect transistor, having its source/drain electrodes individually connected to said input line and said output line and its gate electrode connected to said first node;
    said means for transferring charge from said input line to a second capacitive node comprises an enhancement field effect transistor, having its source/drain electrodes individually connected to said input line and said second capacitive node and its gate electrode connected to said first node; and
    said diode means comprises a natural field effect transistor, having its source electrode connected to said first capacitive node and its gate and drain electrodes connected to said second capacitive node.

6. The high voltage pass circuit recited in claim 3, wherein said first capacitive device has an operative capacitance at least three times greater than the operative capacitance of either said first capacitive node or said second capacitive node.

7. The high voltage pass circuit recited in claim 4, wherein said first and second capacitive devices are substantially identical in capacitance and have an operative capacitance at least three times greater than the operative capacitance on either said first capacitive node or said second capacitive node.

8. The high voltage pass circuit recited in claim 5, further comprising:
    an enhancement field effect transistor having its source/drain electrodes individually connected to a first line and said input line;
    a blocking circuit capacitive device, connected by a first terminal to the gate electrode of said enhancement field effect transistor;
    a source of clock signals coupled to a second terminal of said blocking circuit capacitive device; and
    a depletion field effect transistor having one source/drain electrode connected to said gate electrode of said enhancement field effect transistor, having the other source/drain electrode and its gate electrode connected to said first line, and characterized in that said depletion field effect transistor is of such light depletion that the body effect attributable to a high voltage on said first line changes said field effect transistor from a depletion mode device to an enhancement mode device.

9. The circuit recited in claim 8, wherein:

said sources of clock signals are selectively decoupled from said circuit by decoupling circuits which are operated in synchronism with the signal on an enable line; and said means for precharging said first capacitive node comprises a conductive path between said enable line and said first node formed through the source/drain path of an enhancement field effect transistor which is conductively biased.

10. A negative voltage blocking circuit for conducting current in one direction between a first line and a second line, comprising:

an enhancement field effect transistor having its source/drain electrodes individually connected to said first line and said second line;

a blocking circuit capacitive device, connected by a first terminal to the gate electrode of said enhancement field effect transistor;

a source of clock signals coupled to a second terminal of said blocking circuit capacitive device; and a depletion field effect transistor having one source/drain electrode connected to said gate electrode of said enhancement field effect transistor, having the other source/drain electrode and its gate electrode connected to said first line, and characterized in that said depletion field effect transistor is of such light depletion that the body effect attributable to a high voltage on said first line changes said field effect transistor from a depletion mode device to an enhancement mode device.

* * * * *